United States Patent
Dudding

(10) Patent No.: US 11,573,254 B2
(45) Date of Patent: Feb. 7, 2023

(54) SYSTEMS FOR DETECTING TEMPERATURE AND CURRENT EVENTS IN A POWER GRID AND RELATED METHODS

(71) Applicant: Sensus Spectrum, LLC, Morrisville, NC (US)

(72) Inventor: Andrew Dudding, Cary, NC (US)

(73) Assignee: Sensus Spectrum, LLC, Morrisville, NC (US)

( * ) Notice: Subject to any disclaimer, the term of this patent is extended or adjusted under 35 U.S.C. 154(b) by 0 days.

(21) Appl. No.: 17/340,388

(22) Filed: Jun. 7, 2021

(65) Prior Publication Data

US 2021/0382098 A1 Dec. 9, 2021

Related U.S. Application Data

(60) Provisional application No. 63/036,625, filed on Jun. 9, 2020, provisional application No. 63/036,616, filed on Jun. 9, 2020.

(51) Int. Cl.

| | |
|---|---|
| *G01R 22/06* | (2006.01) |
| *H02J 13/00* | (2006.01) |
| *G01K 3/00* | (2006.01) |
| *G01R 19/165* | (2006.01) |
| *G01K 1/02* | (2021.01) |

(52) U.S. Cl.
CPC ............ *G01R 22/068* (2013.01); *G01K 1/026* (2013.01); *G01K 3/005* (2013.01); *G01R 19/16571* (2013.01); *H02J 13/00002* (2020.01); *H02J 13/00016* (2020.01)

(58) Field of Classification Search
CPC ............ G01R 22/068; G01R 19/16571; G01K 1/026; G01K 3/005; G01K 1/024; H02J 13/00002; H02J 13/00016; H02J 3/0012; H02J 13/00022; G08B 21/182
See application file for complete search history.

(56) References Cited

U.S. PATENT DOCUMENTS 6,847,300 B2  1/2005  Yee et al.
8,830,083 B2  9/2014  LaFrance et al.
(Continued)

FOREIGN PATENT DOCUMENTS

CN     202230153 U   5/2012
KR     101535923 B1  7/2015
WO  WO 2020053085 A1  3/2020

*Primary Examiner* — Alvaro E Fortich
*Assistant Examiner* — Zannatul Ferdous
(74) *Attorney, Agent, or Firm* — Stanek Lemon Crouse & Meeks, PA

(57) ABSTRACT

A system that detects temperature and current events in a power grid is provided. The system includes at least one sensor associated with an electric meter; a plurality of bus bars connected to the electric meter; at least one temperature sensor uniquely associated with each of the plurality of bus bars; and at least one current sensor uniquely associated with each of the plurality of bus bars. The system detects a plurality of temperatures and/or currents and compares the detected plurality of temperatures and/or currents to expected thresholds or threshold ranges for temperatures and/or currents in the system to provide a comparison result and determines if a notification related to temperature and/or current events in the system should be sent based on the comparison result.

18 Claims, 5 Drawing Sheets

(56) References Cited

U.S. PATENT DOCUMENTS

| | | | |
|---|---|---|---|
| 9,196,141 B1* | 11/2015 | Schmidt | G08B 21/14 |
| 10,393,791 B2 | 8/2019 | Minch et al. | |
| 10,509,061 B2 | 12/2019 | Brown | |
| 10,705,126 B2 | 7/2020 | Cook | |
| 2010/0238596 A1* | 9/2010 | Wittner | H02H 1/0015 |
| | | | 361/42 |
| 2014/0225737 A1* | 8/2014 | Brown | G01R 11/25 |
| | | | 340/588 |
| 2015/0377949 A1 | 12/2015 | Ramirez | |
| 2017/0016943 A1 | 1/2017 | Martin et al. | |
| 2019/0094285 A1* | 3/2019 | Minich | G01R 35/04 |
| 2021/0080514 A1* | 3/2021 | Beaudet | G01R 19/2513 |
| 2021/0108971 A1* | 4/2021 | Blair | G01R 15/18 |

\* cited by examiner

SYSTEMS FOR DETECTING TEMPERATURE AND CURRENT EVENTS IN A POWER GRID AND RELATED METHODS

CLAIM OF PRIORITY

The present application claims priority to U.S. Provisional Application Ser. No. 63/036,616, filed Jun. 9, 2020 entitled METHODS, SYSTEMS AND COMPUTER PROGRAM PRODUCTS FOR DETECTING OVER TEMPERATURE EVENTS and U.S. Provisional Application Ser. No. 63/036,625, filed Jun. 9, 2020 entitled METHODS, SYSTEMS AND COMPUTER PROGRAM PRODUCTS FOR DETECTING CURRENT OVERLOAD INA METER, the contents of which are hereby disclosed herein by reference as if set forth in their entirety.

FIELD

The present inventive concept relates generally to meters and, more particularly, to electric meters and sensing temperatures and currents associated therewith.

BACKGROUND

Electric meters measure the amount of electric energy consumed by particular, load, for example, a residence, an office building, an apartment building or electrically powered equipment. Electric utilities use electric meters installed at customers' premises to measure electric energy delivered to their customers for, for example, billing purposes. This usage data may also be used for other reasons. Electric meters and the customers consuming the electricity may be part of a power grid.

A power grid is a system of producers and consumers of electricity. For example, the power grid may include power generators, the users of electricity, switches that control the electricity, and the system of substations, power lines, and transformers that deliver the electricity. More recently, power grids have become "smart." The main difference between the smart grid and conventional power grid is that the smart grid is based on demand follows supply while the conventional power grid is based on supply follows demand. In other words, the smart grid may include "smart devices", for example, smart electric meters, that can communicate with one another and allow needs of the grid to be predicted and supplied on the basis of these communications. The smart grid may be powered by both renewable energy sources and finite energy sources.

Electric meters can be subject to operating conditions that cause the meter itself to become excessively hot. Excessive heat can cause a meter to fail and may even damage the meter and other devices and systems on the power grid. Electric meters can also be subject to fault conditions during which a very large amount of current will flow through the meter. This situation can cause damage to the meter itself or the surrounding system. Excessive current can cause a meter to fail and may even damage the meter and other devices and systems on the power grid. Improved temperature sensing methods and improved methods for sensing current overload are desired.

SUMMARY

Some embodiments of the present inventive concept provide a system that detects temperature and current events in a power grid, the system including at least one sensor associated with an electric meter; a plurality of bus bars connected to the electric meter; at least one temperature sensor uniquely associated with each of the plurality of bus bars; and at least one current sensor uniquely associated with each of the plurality of bus bars. The system detects a plurality of temperatures and/or currents and compares the detected plurality of temperatures and/or currents to expected thresholds or threshold ranges for temperatures and/or currents in the system to provide a comparison result and determines if a notification related to temperature and/or current events in the system should be sent based on the comparison result.

In further embodiments, the system may further include an event generating module configured to receive current readings from the at least one current sensor associated each of the plurality of bus bars; calculate expected temperature ranges for each of the received current readings; receive temperature readings from the at least one temperature sensor associated with the meter; and compare the calculated temperature ranges and the received temperature readings to determine if received temperature readings exceed the calculated temperature readings.

In still further embodiments, expected thresholds for one of the plurality of bus bars may be determined based on heat rise generated by current flowing in the bus bar. The expected temperature for a given current is: $E(T)=T(I)+-t$; wherein $E(T)$ is the range of valid temperatures; $T(I)$ is the temperature mapping function with current; I is the current input to the temperature mapping function, and t provides a tolerance range that adjusts the mapping.

In some embodiments, the system may further include an event generating module that determines an amount of current flowing through the plurality of bus bars using one of a step change and proportional change providing a variable threshold based on the amount of current flowing through each of the plurality of bus bars.

In still further embodiments, the system may further include a communications module. If it is determined that a notification related to temperature and/or current events in the system should be sent based on the comparison result, the communications module may issue the notification to a remote location.

In some embodiments, multiple thresholds may be established for the system. When a first of the multiple thresholds is exceeded, a warning may be transmitted by the communications module. When a second higher threshold is exceeded, an alarm may be transmitted by the communications module.

In further embodiments a temperature obtained by the at least one sensor associated with an electric meter may be compared to temperatures obtained by the at least one temperature sensor uniquely associated with each of the plurality of bus bars. If the temperatures obtained by the at least one temperature sensor uniquely associated with each of the plurality of bus bars exceeds the temperature obtained by the at least one sensor associated with the electric meter, one of a warning and an alarm may be transmitted.

In still further embodiments, temperatures obtained by the at least one temperature sensor uniquely associated with each of the plurality of bus bars may be compared. One of a warning and an alarm may be transmitted if a difference between the bus bar temperatures exceeds a threshold.

In some embodiments, the system may further include an event generating module that monitors a change in amplitude over a period of time of a rising temperature characteristic and a falling temperature characteristic. The event generating module may be configured to issue a flag if the change in amplitude of at least one of the rising temperature characteristic and the falling temperature characteristic exceeds the expected threshold or threshold ranges; and examining events surrounding the flagged change in amplitude to determine if a current overload event has occurred or will likely occur in the future.

In further embodiments, the event generating module further may examine a temperature slope. If the temperature slope, both rising and falling, are within the period of time of the rising temperature characteristic and the falling temperature characteristic and exceeds rising and falling temperature slope thresholds, the temperature slope may be flagged and examined to determine if a current overload event has occurred or will likely occur in the future.

Still further embodiments of the present inventive concept provide a method for detecting temperature and current events in a system including a power grid, the system including at least one sensor associated with an electric meter; a plurality of bus bars connected to the electric meter; at least one temperature sensor uniquely associated with each of the plurality of bus bars; and at least one current sensor uniquely associated with each of the plurality of bus bars. The method includes detecting a plurality of temperatures and/or currents in the system using the sensors; and comparing the detected plurality of temperatures and/or currents to expected thresholds or threshold ranges for temperatures and/or currents in the system to provide a comparison result; and determining if a notification related to temperature and/or current events in the system should be sent based on the comparison result.

DETAILED DESCRIPTION

Figure 1:
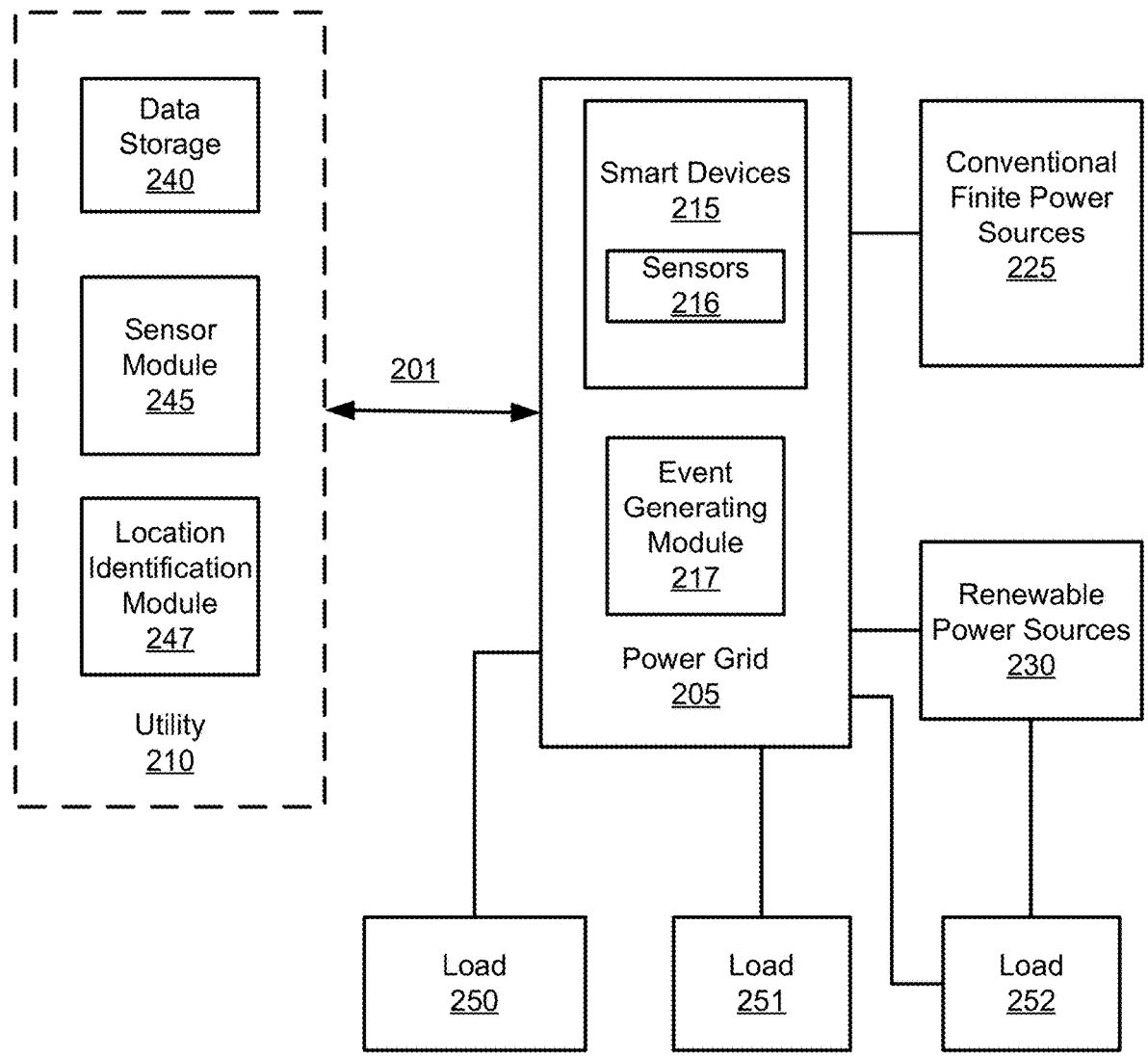
FIG. 1 is a block diagram illustrating a system including smart devices, including electric meters, in accordance with some embodiments of the present inventive concept.

The present inventive concept will be described more fully hereinafter with reference to the accompanying figures, in which embodiments of the inventive concept are shown. This inventive concept may, however, be embodied in many alternate forms and should not be construed as limited to the embodiments set forth herein.

Accordingly, while the inventive concept is susceptible to various modifications and alternative forms, specific embodiments thereof are shown by way of example in the drawings and will herein be described in detail. It should be understood, however, that there is no intent to limit the inventive concept to the particular forms disclosed, but on the contrary, the inventive concept is to cover all modifications, equivalents, and alternatives falling within the spirit and scope of the inventive concept as defined by the claims. Like numbers refer to like elements throughout the description of the figures.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises", "comprising," "includes" and/or "including" when used in this specification, specify the presence of stated features, integers, steps, operations, elements, and/or components, but do not preclude the presence or addition of one or more other features, integers, steps, operations, elements, components, and/or groups thereof. Moreover, when an element is referred to as being "responsive" or "connected" to another element, it can be directly responsive or connected to the other element, or intervening elements may be present. In contrast, when an element is referred to as being "directly responsive" or "directly connected" to another element, there are no intervening elements present. As used herein the term "and/or" includes any and all combinations of one or more of the associated listed items and may be abbreviated as "/".

Unless otherwise defined, all terms (including technical and scientific terms) used herein have the same meaning as commonly understood by one of ordinary skill in the art to which this inventive concept belongs. It will be further understood that terms used herein should be interpreted as having a meaning that is consistent with their meaning in the context of this specification and the relevant art and will not be interpreted in an idealized or overly formal sense unless expressly so defined herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element without departing from the teachings of the disclosure. Although some of the diagrams include arrows on communication paths to show a primary direction of communication, it is to be understood that communication may occur in the opposite direction to the depicted arrows.

As discussed above, electric/electricity meters are associated with customers of the utility and provide usage information to the utility about the customer location. Electricity meters can be subject to severe improper operating conditions that can make them excessively hot. Increased temperatures in an electric meter is undesirable as it can cause the meter to fail once certain temperatures are exceeded or worse may damage the meter and elements around the meter. Thus, some embodiments of the present inventive concept provide methods and systems for identifying meters having increased temperatures are provided. Existing approaches often rely on a single temperature sensor that provides an average overall reading for conditions in the meter. However, using a single temperature sensor may not provide enough notice of the increased temperature before irreparable damage is done.

Methods and devices for reducing meter failures are discussed in, for example, commonly assigned U.S. Pat. No. 9,052,351 entitled A METHOD AND APPARATUS FOR PREVENTING ELECTRICITY METER FAILURE, the contents of which are hereby incorporated herein by reference as if set forth in its entirety.

Accordingly, some embodiments of the present inventive concept provide multiple temperature sensors to provide a more fine grained and nuanced view of meter temperature, thus, allowing the meter owner to be alerted to conditions of failure or pending failure sooner. The ability to detect these temperature excesses and mitigate the conditions causing the heat may reduce the likelihood of meter failure, or possibly allow meter failure to be prevented, and may also possibly prevent any damage spreading beyond the enclosure of the meter itself to surrounding elements in the power grid (smart grid).

Referring now to FIG. 1, a system 200 including a smart grid and electric meters in accordance with some embodiments of the present inventive concept will be discussed. As illustrated in FIG. 1, the system 200 includes a power grid 205, conventional finite power sources 225, renewable power sources 230, a utility 210 and a series of loads 250, 251 and 252. Although FIG. 1 illustrates a particular number of each element, it will be understood that this system 200 is only provided as an example. Thus, embodiments of the present inventive concept are not limited to this configuration. For example, there may be more than one utility and more or less than three loads without departing from the scope of the present inventive concept.

As further illustrated in FIG. 1, the utility 210 includes a data storage module 240, a sensor module 245 and a location identification module 247. It will be understood that the utility of FIG. 1 is provided as an example only and that embodiments of the present inventive concept are not limited thereto. The modules may be combined or more modules may be included without departing from the scope of the present inventive concept. Furthermore, the dotted line of the utility 210 indicates that the modules provided therein may be part of the utility or may be separate from the utility without departing from the scope of the present inventive concept.

Figure 2:
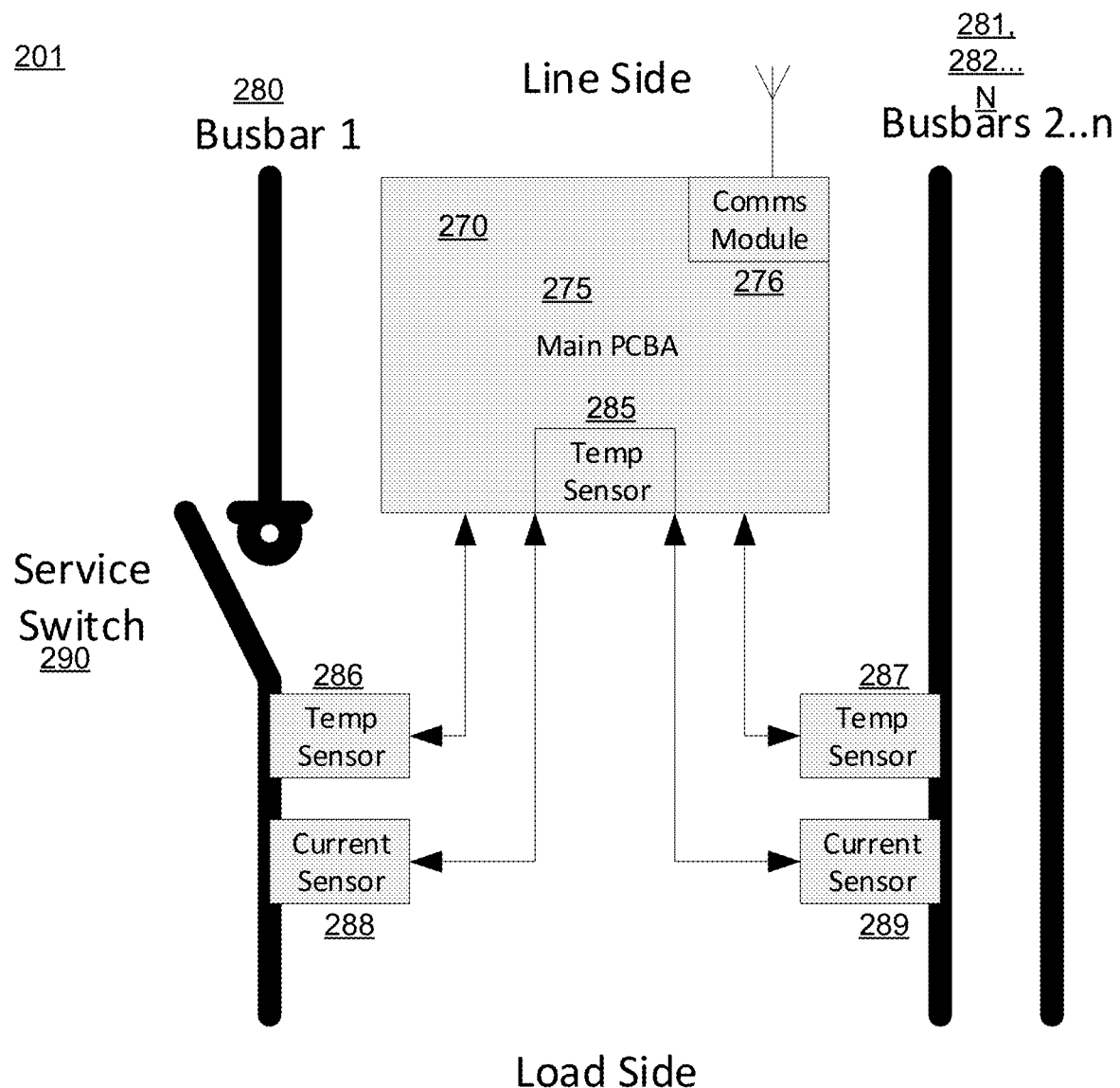
FIG. 2 is a block diagram illustrating an electric meter and associated bus bars showing relative positions of sensors and bus bars in accordance with embodiments of the present inventive concept, wherein N bus bars may have N service switches.

As discussed above, a power grid is a system of producers and consumers of electricity. For example, the power grid may include electric meters, power generators, the users of electricity, switches that control the electricity, and the system of substations, power lines, and transformers that deliver the electricity. As illustrated in FIG. 1, the power grid includes smart devices 215, for example, smart electric meters that can communicate with the other devices, loads and utilities over a communication line 201. This communication line 201 can be wired or wireless without departing from the scope of the present inventive concept. The power grid 205 receives energy from both finite 225 and renewable 230 energy sources. A finite energy source 225 may include, for example, coal, oil or natural gas. A renewable energy source 230 may be any source that is naturally replenished, for example, energy derived from solar, wind, geothermal or hydroelectric action. As illustrated in FIG. 2, the renewable energy sources 230 may be connected to the power grid 205 and/or to a specific load 252. For example, solar panels on a home or building (load) may provide power directly to the home or building and not to the power grid 205. However, a solar farm may provide power directly to the power grid 205, which then may be distributed to the various loads 250, 251 and 252. The loads 250, 251 and 252 may be any entity that consumes power from the power grid, for example, residential homes, office buildings and the like.

As discussed above, the electric meters (smart devices 215) in accordance with some embodiments of the present inventive concept include a plurality of sensors 216, for example, temperature sensors or current sensors. Temperature sensors may be used to detect a high temperature event before the event causes problem for the meter or the surrounding system. If an abnormal event is detected, the meter's event generating module 217 may communicate the event to the utility 210 and the location identification module 247 in the utility 210 may determine where the event is taking place in the grid and generate a solution before the over temperature event causes problems as will be discussed further below. Although embodiments of the present inventive concept are discussed as including temperature sensors and current sensors, embodiments of the present inventive concept are not limited thereto. For example, humidity, motion, voltage and other types of sensors may be used without departing from the scope of the present inventive concept.

Referring now to FIG. 2, a block diagram of a system 201 including an electric meter 270 in accordance with some embodiments of the present inventive concept will be discussed. As illustrated in FIG. 2, the system 201 includes an electric meter 270, a plurality of bus bars, 280, 281, 282 . . . . N; a service switch 290 operating on each bus bar, a plurality of temperature sensors 286, 287 and a plurality of current sensors 288, 289. As further illustrated, the electric meter 270 includes a main printed circuit board assembly (PCBA) 275, a communication module 276 and a temperature sensor 285 (sensor module 245). Although only a temperature sensor 285 is shown on the PCBA, embodiments of the present inventive concept are not limited thereto. For example, other types of sensors may be included on the PCBA 275 without departing from the scope of the present inventive concept.

Electricity meters, such as meter 270, consist of electronic parts that are designed to measure voltage and current, across and through one or many bus bars, internal to the meter, that are there to carry electrical energy to an electrical load. As illustrated in FIG. 2, the electricity meter 270 has a temperature sensor 285 mounted on the main PCBA 275 and is associated with a temperature sensor 286, 287 per bus bar 280, 281, respectively. In some embodiments, the electricity meter 270 may also include a wireless communications module 276 that transmits measured data to, for example, a meter owner; operator or utility, so that the meter data can be recorded (data storage 240), analyzed and acted upon when necessary. The data received may include, for example, warnings and alarms, as well as measurement data, which may trigger a response of the meter owner or operator. As further illustrated in FIG. 2, the meter 270 is also associated with current sensors 286, 287 located at each bus bard 280 and 281, respectively.

The temperature, current, voltage etc. data collected using the various sensors may be analyzed to determine if action is needed. Threshold numbers may be calculated for each meter, group of meters or system. When exceeded, these threshold numbers may indicate that the meter is operating outside a safe environment. For example, expected values of meter bus bar temperature can be determined from heat rise generated by current flowing in the bus bar. The expected values can be mapped and a tolerance applied such that a range of values are deemed acceptable for any specific load current flowing in the bus bar. A formula for the expected temperature for a given current is:

$$E(T)=T(I)+-t;  \qquad \text{Eqn. (1)}$$

where $E(T)$ is the range of valid temperatures; $T(I)$ is the temperature mapping function with current; $I$ is the current input to the temperature mapping function, and $t$ provides a tolerance range that adjusts the mapping allowing for an alteration in the installed meters conditions, such as environmental temperature, solar loading, thermal conduction of the meter installation socket, and the like.

A micro-controller provided on the PCBA 275 is configured to take sensor readings of the current (I) (using current sensors 288 and 289) in the bus bar and return a range of expected acceptable values. The same micro-controller takes readings from the temperature sensor 285. A comparison between the returned range of acceptable values and the actual temperature readings from the sensor 285 is performed and it is determined if any temperatures exceed the allowable ranges determined using, for example, Eqn. (1).

However, embodiments of the present inventive concept are not limited to thresholds provided by a formula. In some embodiments, the thresholds for warnings and alarms may be adjusted based on the amount of current flowing through the bus bar using, for example, a step change, proportional change, or some other change. Thus, in some embodiments, the thresholds may be variable based on the amount of current flowing through the bus bar. This may be sensed using sensors 288 and 289 on the bus bars 280 and 281.

As discussed above, the bus bars 280 and 281 each have a dedicated temperature sensor 286 and 287, respectively. Temperatures of individual bus bars 280 and 281 can be measured and compared against the expected value range provided by, for example, the mapping formula of Eqn. (1).

If it is determined that a temperature exceeds the range above the expected values by a programmable threshold then the meter 270, using its installed communications module 276, for example, a FlexNet module, may issue a warning or alarm message depending upon the degree of temperature excess. For example, a warning may be transmitted when a bus bar temperature exceeds the allowable range by a programmable threshold. Alarms may be transmitted when the bus bar temperature exceeds the allowable range by a larger programmable threshold. The warning programmable threshold cannot be larger than the alarm programmable threshold. These thresholds are programmable based on each system and the tolerances associated therewith.

If a measured temperature exceeds the range below the expected values by a programmable threshold then the meter may store this data and use it for further comparison with other measurements.

In some embodiments, temperatures of individual bus bars 280, 281 obtained using the temperature sensors 286, 287 may also be compared to the main PCBA temperature obtained using temperature sensor 285 and, again if exceeding the main PCBA temperature then the meter, using its communications module 276, may issue a warning or alarm message depending upon the degree of temperature excess.

In some embodiments, temperatures of individual bus bars may also be compared against each other and, again if exceeding a certain temperature difference threshold then the meter, using its communications module 276, may issue a warning or alarm message depending upon the degree of temperature excess.

Some meters used in accordance with embodiment discussed herein have a feature called a "service switch" 290 (or remote disconnect). The service switch 290 is used to disconnect electric service between the line and load sides of the meter. As used herein, "line side" refers to a side of the device, for example, the meter, where the wires, coming from a power source that deliver the electricity, are connected. In other words, the line side of the device is the side where the power comes in from the source. The "load side" refers to the side of the meter device (meter) that is consuming the power, i.e. the residence, building of the like. An electrical "load" is an electrical component or portion of a circuit that consumes electricity. Thus, the service switch 290 acts on all bus bars within the meter simultaneously. This switch may be activated electrically using, for example, a solenoid or motor to move the switch contacts together or apart depending on the need to make or break the electric service. Since it is activated electrically it means that it can also be activated remotely by signals received through a communications module internal to the electricity meter. Thus, if embodiments of the present inventive concept provide data indicating that the temperature at the meter is too high, the service switch 290 can be used to remotely discontinue service to avoid damaging the equipment until the situation is investigated.

In other words, in some embodiments, when the temperature detect method according to embodiments discussed herein issues a warning or alarm, the service switch 290 may be activated to disconnect the electric service from the load. Once the load has been disconnected form the electric service, current ceases to flow, and consequently no further internal heating of the electricity meter can occur. This removes one of the conditions that can lead to an overtemperature event.

Figure 3:
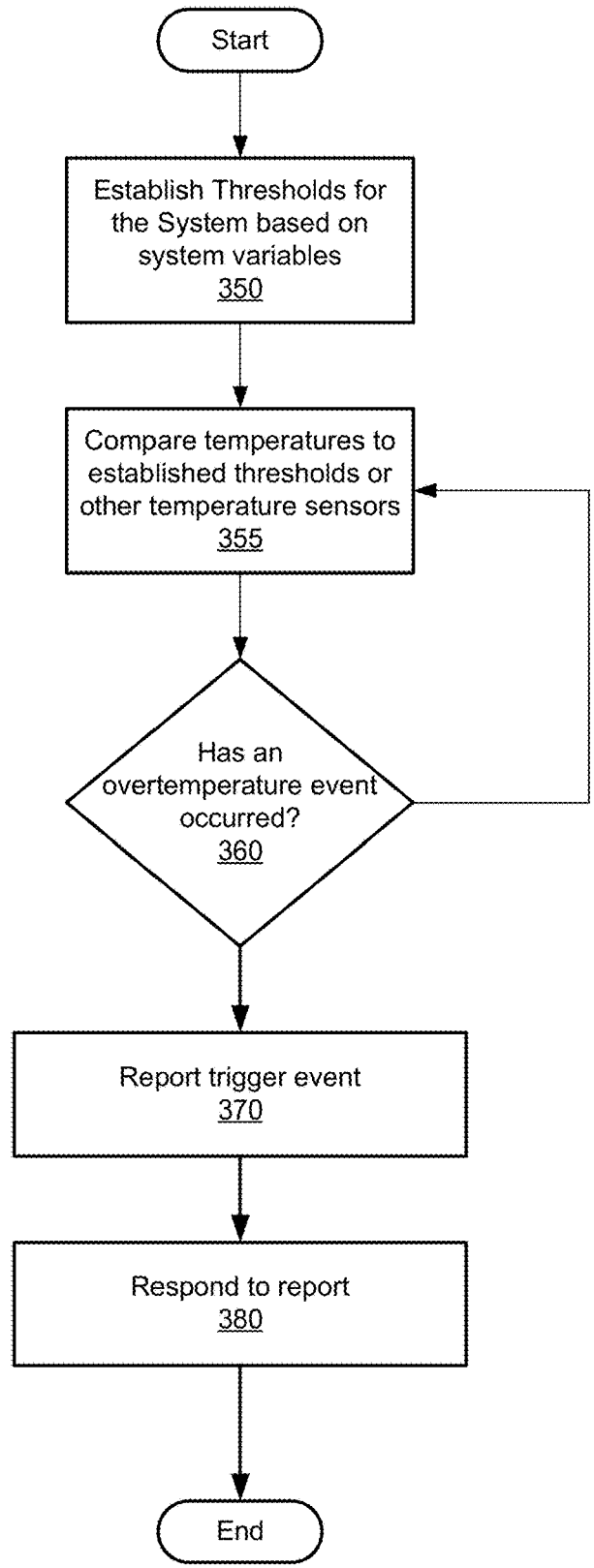
FIG. 3 is a flowchart illustrating operations for detecting over temperature events in a system in accordance with various embodiments of the present inventive concept.

Referring now to FIG. 3, a flowchart illustrating operations for identifying over temperature events in accordance with embodiments of the present inventive concept will be discussed. As illustrated in FIG. 3, operations begin at block 350 by establishing thresholds for the system based on the particular system requirements. The temperatures from the sensor in the meter and/or the sensors associated with the bus bars are compared to the threshold and/or each other (block 355). If it is determined the temperature threshold has been exceeded at any of the various measurement points (block 360), operations proceed to generating a report (block 370). The report may then be responded to (block 380), for example, the load may be remotely disconnected from the line. In other words, the over temperature report may trigger a warning, an alarm or may even cause remote disconnection as discussed above. If, on the other hand, an overtemperature is not detected (block 360), operations return to block 355 and repeat until an overtemperature event occurs.

As briefly discussed above, by providing electricity meters having the ability to distinguish multiple temperatures within the meter by having a temperature sensor on each bus bar and on the main meter electronics PCBA, embodiments of the present inventive concept allow for greater inter-comparison of these sensors to determine if the meter is experiencing an over-temperature event. For example, one bus bar temperature can be compared against the temperature of another bus bar or against the main PCBA temperature to determine which bus bar is experiencing an over-temperature event.

Furthermore, since each bus bar within the electricity meter can be monitored independently for current as well as temperature, embodiments of the present inventive concept map the temperature response of the meter to various levels and changes in bus bar current. Should the temperatures of the bus bars (together or separately) exceed levels that are unexpected for the present operating conditions then an over-temperature event may be detected. Accordingly, some embodiments of the present inventive concept provide early detection of dangerous conditions before these conditions cause injury or damage.

In addition to overtemperature events, electricity meters are sometimes subjected to fault conditions during which a very large amount of current will flow through the meter. If an electricity meter is subjected to a current overload, a very large amount of current will flow through the meter potentially damaging the meter. The damage may be small and benign because meters are designed to withstand a lot of current overload, but most often the meter function will be compromised in some way. Unless the meter has been catastrophically damaged, the meter operator may have no idea that the meter has been compromised.

Accordingly, embodiments of the present inventive concept will be discussed that provide methods for detecting large amounts of current by identifying characteristics of these types of events and providing a warning or alarm to the meter operator indicating that the condition exists. Using embodiments of the present inventive concept discussed herein, an occurrence of a current overload can be identified and, it may be possible to communicate the overload event to a meter operator through a communications network. The ability to detect these current overloads and mitigate the conditions causing current overload may reduce the likelihood of meter failure, or possibly allow meter failure to be prevented, and may also possibly prevent any damage spreading beyond the enclosure of the meter itself to surrounding elements in the power grid (smart grid).

Referring again to FIG. 1, electric meters (smart devices 215) in accordance with some embodiments of the present inventive concept include a plurality of sensors 216, for example, temperature sensors 285, 286 and 287 and current sensors 288, 289 that may be used to detect a current overload event before the event causes a problem for the meter or the surrounding system. If an abnormal event is detected, the meter's event generating module 217 may communicate the event to the utility 210 and the modules in the utility may determine where the event is taking place in the grid (247) and possibly generate a solution (disconnect the load from the line) before the current overload event causes problems as will be discussed further below. As discussed above, although embodiments of the present inventive concept are discussed as including temperature sensors and current sensors, embodiments of the present inventive concept are not limited thereto. For example, humidity, motion, voltage, vibration and other types of sensors may be used without departing from the scope of the present inventive concept.

Current overloads are generally short term events where a lot of electrical energy passes through an electricity meter in a relatively short amount of time. As used herein, "electrical energy" is considered high if the current is above the rated current of the meter. It will be understood that these currents may change depending on the system and the thresholds for a current overload may change depending on the system. Generally, a current overload may last from a few microseconds to several seconds.

A current overload event may cause the temperature of the bus bars carrying the current to increase. Thus, the temperature change may be a direct function of the amount of, and duration of, the current overload. The current overload is considered to be an impulse event since it generally has a limited duration as discussed above. The bus bar carrying the current overload has a unique thermal signature to the overload event.

Electricity meters that have thermal sensing of the current carrying bus bars are able to detect the current overload thermal signature. As illustrated in FIG. 2, the electricity meter 270 has current sensing of the current carrying bus bars. Micro-controllers on the main PCBA 275 of the electricity meter take thermal and current sensor data and measure the bus bar temperature and current over time to verify if the changes in thermal data match that of a current overload.

Embodiments of the present inventive concept for detecting a current overload identify two unique characteristics in the thermal data, a rising temperature characteristic and a falling temperature characteristic. The rising characteristic has a very rapid initial change with a slowly decaying rate of increase. This will continue for the duration of the overload current impulse period. The falling characteristic begins once the overload has ended. The falling characteristic is a decay function where the temperature will decay back to the surrounding environmental temperature. Each characteristic has a change in amplitude and a period over which that change will occur. The changes in amplitude are compared over a programmable period of time for each characteristic.

If this comparison reveals that the rising temperature amplitude rises through a programmable threshold (depending on the system) within the programmable rising time period, the rising temperature characteristic portion of the algorithm can be considered as triggered or flagged. Once trigger or flagged, the falling temperature characteristic is then examined. The falling temperature amplitude algorithm cannot start until the temperature is actually falling, so the algorithm must first wait until a peak temperature is detected.

If the falling temperature amplitude falls through a programmable threshold within the programmable falling time period, then the falling temperature characteristic part of the algorithm can be considered as triggered or flagged.

Furthermore, in some embodiments, the rate of change of temperature may also be considered. The rate of change of temperature is called the "temperature slope." If the temperature slope, both rising and falling, are within the same rising and falling periods as discussed above, and exceeds rising and falling temperature slope thresholds, then the rising and falling temperature slope characteristics may also be considered triggered or flagged.

Once any rising and falling characteristic of the algorithm has been triggered, warning and alarm messages may be sent over the meter communication system, for example, Sensus' FlexNet, so that the meter operator may act accordingly to the information. For example, the load may be disconnected remotely as discussed below.

A variation in the amplitude and slope rising and falling thresholds provides two thresholds for each characteristic. In some embodiments, once the first threshold is exceeded a warning may be sent and once the second threshold is exceeded an alarm may be sent immediately.

In some embodiments, temperature measurements discussed above may be enhanced with additional electric current measurements and the same analyses may be performed with the electric current measurements. Rising and falling amplitude and period thresholds as described above also apply in these embodiments. It will also be understood that any of the measurements triggering a flag may be combined with other measurements and used to determine if a current overload event is present in the system without departing from the scope of the present inventive concept.

As discussed above, if embodiments of the present inventive concept provide data indicating that a current overload event is occurring at the meter, the service switch 290 can be used to remotely discontinue service to avoid damaging the equipment until the situation is investigated.

In other words, in some embodiments, when a current overload event according to embodiments discussed herein issues a warning or alarm, the service switch 290 may be activated to disconnect the electric service from the load. Once the load has been disconnected form the electric service, current ceases to flow.

Figure 4:
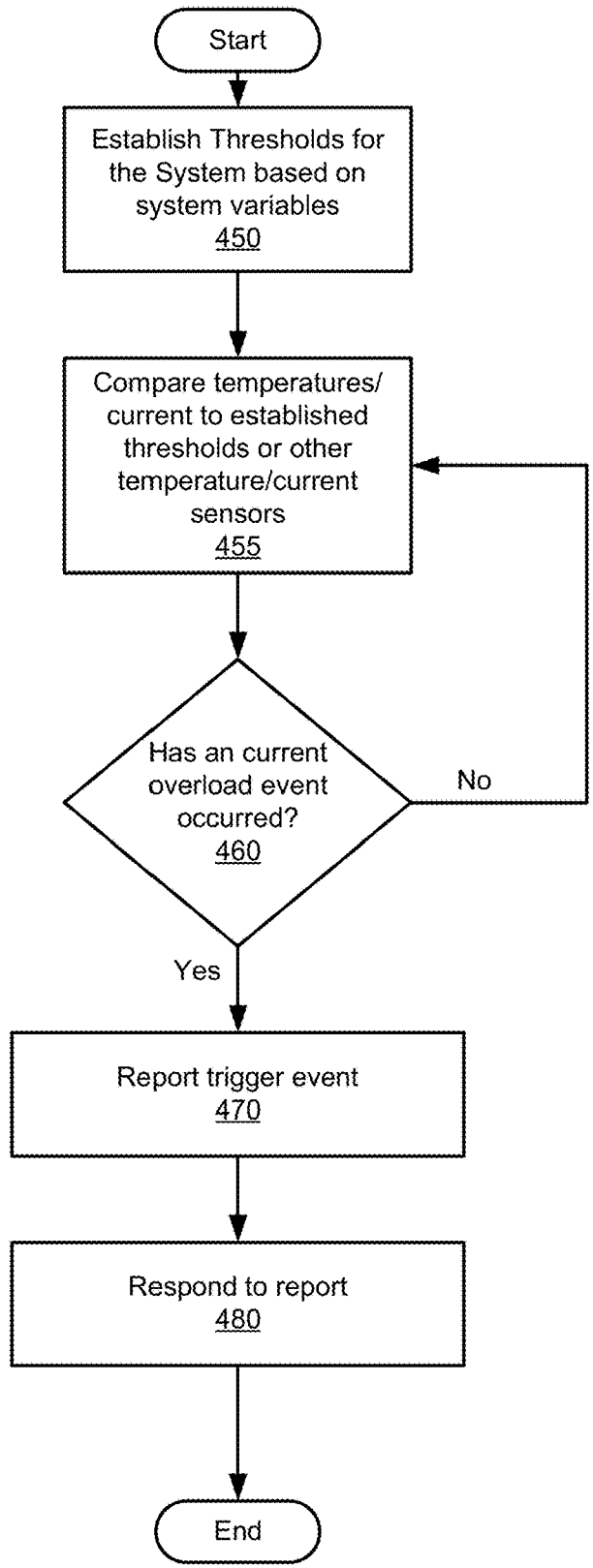
FIG. 4 is a flowchart illustrating operations for detecting current overload events in a system in accordance with various embodiments of the present inventive concept.

Referring now to FIG. 4, a flowchart illustrating operations for identifying current overload events in accordance with embodiments of the present inventive concept will be discussed. As illustrated in FIG. 4, operations begin at block 450 by establishing thresholds for the system based on the particular system requirements. The temperatures/currents from the sensor in the meter and/or the sensors associated with the bus bars are compared to the threshold and/or each other (block 455). As discussed above, the temperatures and/or currents may be observed to determine if a rising temperature/current characteristic and a falling temperature/current characteristic are present and/or if the temperature/current slope exceeds a set threshold. It is determined if one or more thresholds has been exceeded at any of the various measurement points (block 460), operations proceed to generating a report 370 and responding to the report 480. The current overload report may trigger a warning, an alarm or may even cause remote disconnection as discussed above. If, on the other hand, an current overload is not detected (block 460), operations return to block 455 and repeat until an over-temperature event occurs.

Figure 5:
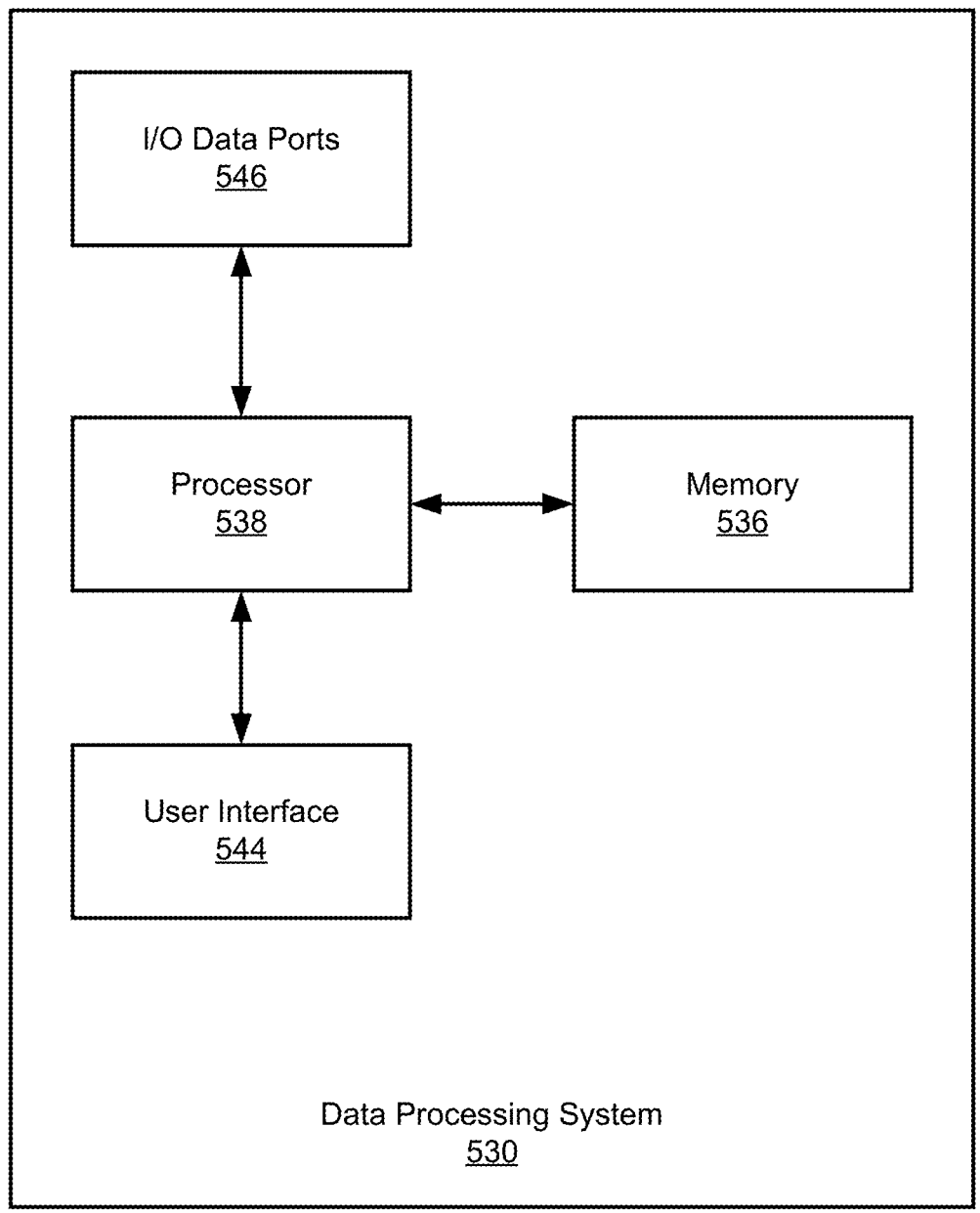
FIG. 5 is a block diagram of a data processing system in accordance with some embodiments of the present inventive concept.

As is clear from the embodiments discussed above, some aspects of the present inventive concept may be implemented by a data processing system. The data processing system may be included at any module of the system without departing from the scope of the preset inventive concept. Exemplary embodiments of a data processing system 530 configured in accordance with embodiments of the present inventive concept will be discussed with respect to FIG. 5. The data processing system 530 may include a user interface 544, including, for example, input device(s) such as a keyboard or keypad, a display, a speaker and/or microphone, and a memory 536 that communicate with a processor 538. The data processing system 530 may further include I/O data port(s) 546 that also communicates with the processor 538. The I/O data ports 546 can be used to transfer information between the data processing system 530 and another computer system or a network using, for example, an Internet Protocol (IP) connection. These components may be conventional components such as those used in many conventional data processing systems, which may be configured to operate as described herein.

As briefly discussed above, as electricity meters having the ability to distinguish multiple temperatures within the meter by having a temperature sensor/current sensor on each bus bar and on the main meter electronics PCBA, embodiments of the present inventive concept allow for greater inter-comparison of these sensors to determine if the meter is experiencing an current overload event.

As will be appreciated by one of skill in the art, the inventive concept may be embodied as a method, data processing system, or computer program product. Accordingly, the present inventive concept may take the form of an entirely hardware embodiment or an embodiment combining software and hardware aspects all generally referred to herein as a "circuit" or "module." Furthermore, the present inventive concept may take the form of a computer program product on a computer-usable storage medium having computer-usable program code embodied in the medium. Any suitable computer readable medium may be utilized including hard disks, CD-ROMs, optical storage devices, a transmission media such as those supporting the Internet or an intranet, or magnetic storage devices.

Computer program code for carrying out operations of the present inventive concept may be written in an object-oriented programming language such as Java®, Smalltalk or C++. However, the computer program code for carrying out operations of the present inventive concept may also be written in conventional procedural programming languages, such as the "C" programming language or in a visually oriented programming environment, such as VisualBasic.

The program code may execute entirely on the user's computer, partly on the user's computer, as a stand-alone software package, partly on the user's computer and partly on a remote computer or entirely on the remote computer. In the latter scenario, the remote computer may be connected to the user's computer through a local area network (LAN) or a wide area network (WAN), or the connection may be made to an external computer (for example, through the Internet using an Internet Service Provider).

The inventive concept is described in part above with reference to a flowchart illustration and/or block diagrams of methods, systems and computer program products according to embodiments of the inventive concept. It will be understood that each block of the illustrations, and combinations of blocks, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the block or blocks.

It should be emphasized that the above-described embodiments of the present disclosure are merely possible examples of implementations set forth for a clear understanding of the principles of the disclosure. It is, of course, not possible to describe every conceivable combination of components and/or methodologies, but one of ordinary skill in the art may recognize that many further combinations and permutations are possible. That is, many variations and modifications may be made to the above-described embodiment(s) without departing substantially from the spirit and principles of the disclosure. All such modifications and variations are intended to be included herein within the scope of this disclosure and protected by the following claims.

What is claimed is:

1. A system that detects temperature and current events in a power grid, the system comprising:
   at least one sensor associated with an electric meter;
   a plurality of bus bars connected to the electric meter;
   at least one temperature sensor uniquely associated with each of the plurality of bus bars; and at least one current sensor uniquely associated with each of the plurality of bus bars;

wherein the system detects a plurality of temperatures and/or currents and compares the detected plurality of temperatures and/or currents to expected thresholds or threshold ranges for temperatures and/or currents in the system to provide a comparison result and determines if a notification related to temperature and/or current events in the system should be sent based on the comparison result; and wherein expected thresholds for one of the plurality of bus bars is determined based on heat rise generated by current flowing in the bus bar, the expected temperature for a given current is:

$$E(T)=T(I)+-t;$$

wherein E(T) is the range of valid temperatures; T(I) is the temperature mapping function with current; I is the current input to the temperature mapping function, and t provides a tolerance range that adjusts the mapping.

2. The system of claim 1, further comprising an event generating module, wherein the event generating module is configured to:
  receive current readings from the at least one current sensor associated each of the plurality of bus bars;
  calculate expected temperature ranges for each of the received current readings;
  receive temperature readings from the at least one temperature sensor associated with the meter; and
  compare the calculated temperature ranges and the received temperature readings to determine if received temperature readings exceed the calculated temperature readings.

3. The system of claim 1, further comprising an event generating module that determines an amount of current flowing through the plurality of bus bars using one of a step change and proportional change providing a variable threshold based on the amount of current flowing through each of the plurality of bus bars.

4. The system of claim 1, further comprising a communications module, wherein if it is determined that a notification related to temperature and/or current events in the system should be sent based on the comparison result, the communications module issues the notification to a remote location.

5. The system of claim 4:
  wherein multiple thresholds are established for the system;
  wherein when a first of the multiple thresholds is exceeded, a warning is transmitted by the communications module; and
  wherein when a second higher threshold is exceeded, an alarm is transmitted by the communications module.

6. The system of claim 1:
  wherein a temperature obtained by the at least one sensor associated with an electric meter is compared to temperatures obtained by the at least one temperature sensor uniquely associated with each of the plurality of bus bars; and
  wherein if the temperatures obtained by the at least one temperature sensor uniquely associated with each of the plurality of bus bars exceeds the temperature obtained by the at least one sensor associated with the electric meter, one of a warning and an alarm is transmitted.

7. The system of claim 1:
  wherein temperatures obtained by the at least one temperature sensor uniquely associated with each of the plurality of bus bars are compared; and
  wherein one of a warning and an alarm is transmitted if a difference between the bus bar temperatures exceeds a threshold.

8. A system that detects temperature and current events in a power grid, the system comprising:
  at least one sensor associated with an electric meter;
  a plurality of bus bars connected to the electric meter;
  at least one temperature sensor uniquely associated with each of the plurality of bus bars;
  at least one current sensor uniquely associated with each of the plurality of bus bars;
  wherein the system detects a plurality of temperatures and/or currents and compares the detected plurality of temperatures and/or currents to expected thresholds or threshold ranges for temperatures and/or currents in the system to provide a comparison result and determines if a notification related to temperature and/or current events in the system should be sent based on the comparison result; and
  an event generating module that monitors a change in amplitude over a period of time of a rising temperature characteristic and a falling temperature characteristic, the event generating module configured to:
  issue a flag if the change in amplitude of at least one of the rising temperature characteristic and the falling temperature characteristic exceeds the expected threshold or threshold ranges; and
  examining events surrounding the flagged change in amplitude to determine if a current overload event has occurred or will likely occur in the future.

9. The system of claim 8, wherein the event generating module further examines a temperature slope and wherein if the temperature slope, both rising and falling, are within the period of time of the rising temperature characteristic and the falling temperature characteristic and exceeds rising and falling temperature slope thresholds, the temperature slope is flagged and examined to determine if a current overload event has occurred or will likely occur in the future.

10. A method for detecting temperature and current events in a system including a power grid, the system including at least one sensor associated with an electric meter; a plurality of bus bars connected to the electric meter; at least one temperature sensor uniquely associated with each of the plurality of bus bars; and at least one current sensor uniquely associated with each of the plurality of bus bars, the method comprising:
  detecting a plurality of temperatures and/or currents in the system using the sensors; and
  comparing the detected plurality of temperatures and/or currents to expected thresholds or threshold ranges for temperatures and/or currents in the system to provide a comparison result;
  determining if a notification related to temperature and/or current events in the system should be sent based on the comparison result; and
  determining expected thresholds for one of the plurality of bus bars based on heat rise generated by current flowing in the bus bar, the expected temperature for a given current is:

$$E(T)=T(I)+-t;$$

wherein E(T) is the range of valid temperatures; T(I) is the temperature mapping function with current; I is the current input to the temperature mapping function, and t provides a tolerance range that adjusts the mapping.

11. The method of claim 10, further comprising:
receiving current readings from the at least one current sensor associated each of the plurality of bus bars;
calculating expected temperature ranges for each of the received current readings;
receiving temperature readings from the at least one temperature sensor associated with the meter; and
comparing the calculated temperature ranges and the received temperature readings to determine if received temperature readings exceed the calculated temperature readings.

12. The method of claim 10, further comprising determining an amount of current flowing through the plurality of bus bars using one of a step change and proportional change providing a variable threshold based on the amount of current flowing through each of the plurality of bus bars.

13. The method of claim 10, further comprising issuing a notification to a remote location if it is determined that a notification related to temperature and/or current events in the system should be sent based on the comparison result.

14. The method of claim 13, further comprising:
establishing multiple thresholds for the system;
transmitting a warning when a first of the multiple thresholds is exceeded; and
transmitting an alarm when a second higher threshold is exceeded.

15. The method of claim 10, further comprising:
comparing a temperature obtained by the at least one sensor associated with an electric meter to temperatures obtained by the at least one temperature sensor uniquely associated with each of the plurality of bus bars; and
transmitting one of a warning and an alarm if the temperatures obtained by the at least one temperature sensor uniquely associated with each of the plurality of bus bars exceeds the temperature obtained by the at least one sensor associated with the electric meter.

16. The method of claim 10:
comparing temperatures obtained by the at least one temperature sensor uniquely associated with each of the plurality of bus bars; and
transmitting one of a warning and an alarm if a difference between the bus bar temperatures exceeds a threshold.

17. A method for detecting temperature and current events in a system including a power grid, the system including at least one sensor associated with an electric meter; a plurality of bus bars connected to the electric meter; at least one temperature sensor uniquely associated with each of the plurality of bus bars; and at least one current sensor uniquely associated with each of the plurality of bus bars, the method comprising:
detecting a plurality of temperatures and/or currents in the system using the sensors; and
comparing the detected plurality of temperatures and/or currents to expected thresholds or threshold ranges for temperatures and/or currents in the system to provide a comparison result;
determining if a notification related to temperature and/or current events in the system should be sent based on the comparison result;
monitoring a change in amplitude over a period of time of a rising temperature characteristic and a falling temperature characteristic;
issuing a flag if the change in amplitude of at least one of the rising temperature characteristic and the falling temperature characteristic exceeds the expected threshold or threshold ranges; and
examining events surrounding the flagged change in amplitude to determine if a current overload event has occurred or will likely occur in the future.

18. The method of claim 17, further comprising:
examining a temperature slope associated with the rising and falling temperature characteristics;
flagging and examining the temperature slope to determine if a current overload event has occurred or will likely occur in the future if the temperature slope, both rising and falling, are within the period of time of the rising temperature characteristic and the falling temperature characteristic and exceeds rising and falling temperature slope thresholds.

* * * * *

UNITED STATES PATENT AND TRADEMARK OFFICE
CERTIFICATE OF CORRECTION

| | | |
|---|---|---|
| PATENT NO. | : 11,573,254 B2 | |
| APPLICATION NO. | : 17/340388 | |
| DATED | : February 7, 2023 | |
| INVENTOR(S) | : Andrew Dudding | |

It is certified that error appears in the above-identified patent and that said Letters Patent is hereby corrected as shown below:

In the Specification

Column 2, Line 26: delete "E(T)=T(I)+–t" and insert -- E(T) = T(I) +-t --

Column 6, Line 62, Equation 1: delete "E(T)=T(I)+–t" and insert -- E(T) = T(I) +-t --

In the Claims

Column 13, Claim 1, Line 17: delete "E(T)=T(I)+–t" and insert -- E(T) = T(I) +-t --

Column 14, Claim 10, Line 64: delete "E(T)=T(I)+–t" and insert -- E(T) = T(I) +-t --

Signed and Sealed this
Twenty-eighth Day of March, 2023

Katherine Kelly Vidal
*Director of the United States Patent and Trademark Office*